(12) United States Patent
Garland et al.

(10) Patent No.: US 9,728,708 B2
(45) Date of Patent: Aug. 8, 2017

(54) PIEZOELECTRIC MATERIALS AND METHODS OF PROPERTY CONTROL

(71) Applicant: DALHOUSIE UNIVERSITY, Halifax (CA)

(72) Inventors: Philip P. Garland, Fredericton (CA); Robert B. A. Adamson, Halifax (CA); Andre B. Bezanson, Halifax (CA); Jeremy A. Brown, Halifax (CA)

(73) Assignee: DALHOUSIE UNIVERSITY, Halifax, Nova Scotia (CA)

( * ) Notice: Subject to any disclaimer, the term of this patent is extended or adjusted under 35 U.S.C. 154(b) by 437 days.

(21) Appl. No.: 14/352,938

(22) PCT Filed: Oct. 18, 2012

(86) PCT No.: PCT/CA2012/050743
§ 371 (c)(1),
(2) Date: Apr. 18, 2014

(87) PCT Pub. No.: WO2013/056374
PCT Pub. Date: Apr. 25, 2013

(65) Prior Publication Data
US 2014/0306581 A1    Oct. 16, 2014

Related U.S. Application Data

(60) Provisional application No. 61/548,687, filed on Oct. 18, 2011, provisional application No. 61/612,421, filed on Mar. 19, 2012.

(51) Int. Cl.
*H01L 41/18* (2006.01)
*C30B 33/04* (2006.01)
(Continued)

(52) U.S. Cl.
CPC ............ *H01L 41/18* (2013.01); *B06B 1/0622* (2013.01); *C30B 1/04* (2013.01); *C30B 29/30* (2013.01);
(Continued)

(58) Field of Classification Search
CPC ............. C04B 2235/783; H01L 41/044; H01L 41/107; H01L 41/18
(Continued)

(56) References Cited

U.S. PATENT DOCUMENTS 4,917,810 A    4/1990  Tsunooka et al.
5,530,410 A    6/1996  Chu
(Continued)

FOREIGN PATENT DOCUMENTS

EP    2262020 A2    12/2010
JP    9-129943       5/1997
(Continued)

OTHER PUBLICATIONS

Garland et al., Experimental and Finite Element Model Directivity Comparison Between PZT and PMN-PT Kerfless Arrays; 2011 IEEE International Ultrasonics Symposium Proceedings; pp. 365-368.

(Continued)

*Primary Examiner* — Shawki S Ismail
*Assistant Examiner* — Bryan Gordon
(74) *Attorney, Agent, or Firm* — Quarles & Brady LLP

(57) ABSTRACT

Among other things, piezoelectric materials and methods of their manufacture are described; particularly methods of forming regions of varying crystal structure within a relaxor piezoelectric substrate. Such methods may including heating the piezoelectric substrate above the transition temperature and below the Curie temperature such that a first phase transition occurs to a first crystal structure; rapidly cooling (Continued)

the piezoelectric substrate below the transition temperature at a cooling rate that is sufficiently high for the first crystal structure to persist; and applying an electric field through one or more selected regions of the piezoelectric substrate, such that within the one or more selected regions, a second phase transition occurs and results in a second crystal structure.

26 Claims, 7 Drawing Sheets

(51) Int. Cl.
G01S 7/52 (2006.01)
C30B 29/30 (2006.01)
C30B 29/32 (2006.01)
C30B 33/02 (2006.01)
H01L 41/257 (2013.01)
B06B 1/06 (2006.01)
G10K 11/24 (2006.01)
C30B 1/04 (2006.01)
C30B 30/02 (2006.01)
H01L 41/047 (2006.01)
H01L 41/29 (2013.01)
G02B 6/10 (2006.01)

(52) U.S. Cl.
CPC .............. *C30B 29/32* (2013.01); *C30B 30/02* (2013.01); *C30B 33/02* (2013.01); *C30B 33/04* (2013.01); *G01S 7/52* (2013.01); *G10K 11/24* (2013.01); *H01L 41/257* (2013.01); *G02B 6/105* (2013.01); *H01L 41/047* (2013.01); *H01L 41/29* (2013.01); *Y10T 428/24983* (2015.01)

(58) Field of Classification Search
USPC .................................. 310/320, 357, 358, 359
See application file for complete search history.

(56) References Cited

U.S. PATENT DOCUMENTS 8,829,766 B2* 9/2014 Milyutin .............. H01L 41/107
310/333
2002/0135270 A1* 9/2002 Ballandras ......... H03H 9/02574
310/313 R
2004/0232803 A1 11/2004 Matsushita et al.
2008/0015443 A1* 1/2008 Hosono ................ B06B 1/0611
600/459
2008/0074211 A1 3/2008 Miles et al.
2008/0203856 A1* 8/2008 Miyazawa ........... B41J 2/14233
310/358
2008/0316281 A1 12/2008 Loyer
2009/0194732 A1 8/2009 Luo et al.
2009/0273257 A1* 11/2009 Ifuku .................. H01L 41/0973
310/360
2010/0103226 A1* 4/2010 Sakashita ............. B41J 2/14233
347/68
2012/0037839 A1* 2/2012 Hackenberger ......... C30B 11/00
252/62.9 PZ

FOREIGN PATENT DOCUMENTS

JP 09129943 5/1997
WO 8910800 A1 11/1989

OTHER PUBLICATIONS

Akira Kukuoka, English Abstract of JP 9129943A.
Okino et al, Cooling-Rate-Dependent Domain Structures of Pb(mg1/3Nb2/3)O3-PbTiO3 Single Crystals Observed by Contact Resonance Piezoresponse Force Microscopy, Japanese Journal of Applied Physics, vol. 44, No. 9B, 2005, pp. 6808-6811.
Okino et al, Cooling-Rate-Dependent of Dielectric Constant and Domain Structures in (1-x)Pb(mg1/3Nb2/3)O3—xPbTiO3 Single Crystals, Japanese Journal of Applied Physics, vol. 43, No. 9B, 2004, pp. 7160-7164.
International Search Report; PCT/CA2012/050743; 4 pages.
Supplemental European Search Report; EP 12841615; 1 page; dated Apr. 15, 2015.
Yamashita et al; Effects of Manganese Oxides/Gold Composite Electrode on Piezoelectric Properties of Lead Magnesium Niobate Titanate Single Crystal; 2011 The Japan Society of Applied Physics 50 (2011) 09NC05; 4 pages.
JP 09129943 English Abstract; 1 page.

* cited by examiner

PIEZOELECTRIC MATERIALS AND METHODS OF PROPERTY CONTROL

CROSS-REFERENCE TO RELATED APPLICATIONS

This application is a National Phase application claiming the benefit of PCT/CA20 12/050743, filed on Oct. 18, 2012, in English, which further claims priority to U.S. Provisional Patent Application Ser. No, 61/548,687, filed Oct. 18, 2011. This application also claims priority to U.S. Provisional Patent Application Ser. No. 611612,421, filed Mar. 19, 2012. Both applications are hereby incorporated by reference in their entireties.

FIELD OF THE INVENTION

The field of the invention relates to piezoelectric materials, particularly (although not exclusively) piezoelectric materials having specific crystal phases and their manufacture.

BACKGROUND

In recent years, relaxor-PbTiO$_3$ (relaxor-PT) single crystals have generated widespread interest for ultrasonic and actuation applications. Relaxor-PT crystals exhibit an electromechanical coupling close to the theoretical maximum ($k_{33}$>0.9) and piezoelectric voltage-strain coefficients up to a factor of five higher than traditional PZT ceramics. Originally this class of materials included only (1−x)Pb(Mg$_{1/3}$Nb$_{2/3}$)O$_3$-xPbTiO$_3$ (PMN-PT) and Pb(Zn$_{1/3}$Nb$_{2/3}$)O$_3$—PbTiO$_3$ (PZN-PT), but a number of new relaxor-PT crystals have been reported that exhibit higher Curie temperatures and other improved properties. Consequently, relaxor-PT crystals show promise for replacing traditional PZT ceramics in a number of important areas in the coming years. The most widely-available relaxor-PT material is PMN-PT. Much work has been devoted to characterizing the crystallographic phase diagram (shown in FIG. 1) of PMN-PT between room temperature and the Curie temperature over a wide compositional range.

Like other relaxor-PT single crystals, PMN-PT exhibits its strongest piezoelectric effects when the composition is situated near a morphotropic phase boundary (MPB) between two distinct crystalline structures. As can be seen in FIG. 1, PMN-PT with PT concentration below 30%, forms a rhombohedral (3 m) piezoelectric single crystal, while at PT concentrations larger than 35% the crystal exhibits the same tetragonal (4 mm) symmetry of pure PT. It has been suggested that the polarization of the crystal rotates through intermediate monoclinic phases, shown in FIG. 1 which helps to explain the high susceptibility and piezoelectric coefficients of these materials. The room temperature zero-field phase of PMN-PT in the composition range from 30% to 35% is a monoclinic "C" phase denoted MC. The different phases correspond to different directions of the ferroelectric dipole moment of the crystal unit cell relative to the crystalline axes. When heated past a specific temperature, denoted $T_{RT}$ or $T_{McT}$, the dipole moment of the crystal aligns with one of its pseudocubic axes, creating a crystal with tetragonal symmetry. Further heating past the Curie temperature depoles the crystal, destroying the ferroelectric dipole moment altogether, and the crystal assumes cubic symmetry. All relaxor-PT crystals reported thus far exhibit both of these phase transitions temperature within some compositional range, but the first transition at $T_{RT}$ is not observed in traditional piezoelectric ceramics like PZT or in single-domain crystalline piezoelectrics like lithium niobate.

Despite the considerable research that has been devoted to the equilibrium phase diagram of relaxor-PT materials, there has been relatively little work on the non-equilibrium properties of the materials. The crystal structure of these materials transitions between several different possible phases with very little compositional change. As such, the material experiences relatively unstable equilibrium states. The different crystal phases have been shown to exhibit vastly different electrical, mechanical, piezoelectric, pyroelectric and optical properties. The crystal structure of these materials is dependent not only on chemical composition and temperature, but also on applied bias electric field, cooling rate, applied stress and load histories of these factors. In known relaxor-based piezoelectric materials, a single crystal structure phase is present in the material at any one time at room temperature. One study has shown that cooling rate can have an effect on domain size of the resulting crystal but did not demonstrate a crystal structure change. Interestingly, the crystal structure phase transitions and domain size that are associated with bias electric field, heating and cooling rates and applied stress appear to be completely reversible.

There remains a need to develop new piezoelectric materials and methods for control of their properties.

SUMMARY

In general, in an aspect, a method of forming regions of varying crystal structure within a piezoelectric substrate is described. In this method, the piezoelectric substrate has a relaxor piezoelectric composition such that a phase transition to a first crystal structure occurs when the piezoelectric substrate is heated above a transition temperature. The method includes heating the piezoelectric substrate above the transition temperature and below the Curie temperature such that a first phase transition occurs to the first crystal structure; rapidly cooling the piezoelectric substrate below the transition temperature at a cooling rate that is sufficiently high for the first crystal structure to persist; and applying an electric field through one or more selected regions of the piezoelectric substrate, such that within the one or more selected regions, a second phase transition occurs and results in a second crystal structure.

In general, in an aspect, a piezoelectric substrate is described. The substrate has a relaxor piezoelectric composition such that a phase transition to a first crystal structure occurs when the piezoelectric substrate is heated above a transition temperature. It also has a plurality of regions having the first crystal structure and one or more other regions having a second crystal structure.

In general, in an aspect, we describe methods of manipulating the crystal structure phase of a piezoelectric material such that we can readily change the room temperature crystal structure of a single part, or region within a single part, from one state to another or produce a single part with multiple different crystalline phases with different symmetries existing throughout or in specified adjacent regions of the part at room temperature. These differing crystal phases are accompanied by differing material property characteristics. The mismatch in properties of adjacent regions can be used to improve the overall desired performance of devices incorporating piezoelectric materials. Also, the methods described herein can controllably change the operating response characteristics of a piezoelectric material. Properties that can be altered include mechanical, electrical, electromechanical, pyroelectrical and/or optical properties. Control may be selective.

These and other features and aspects, and combinations of them, may be expressed as methods, systems, components, means and steps for performing functions, apparatus, articles of manufacture, compositions of matter, and in other ways. Other advantages and features will become apparent from the following description and claims.

BRIEF DESCRIPTION OF THE DRAWINGS

Embodiments will now be described, by way of example only, with reference to the drawings, in which.

DETAILED DESCRIPTION

Reference Numeral Legend

Figure 1:
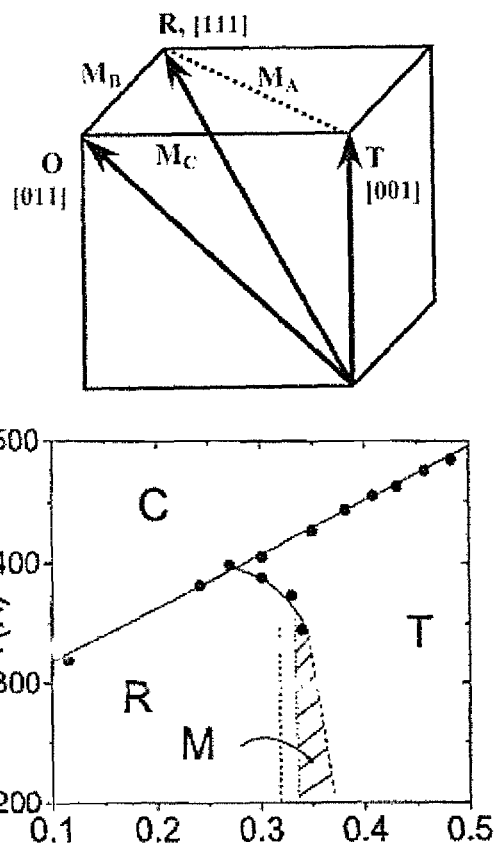
FIG. 1 in the upper part shows the orientation of the ferroelectric dipole moment in different possible phases of a relaxor-PT single crystal including the rhombohedral (R), orthorhombic (O) and tetragonal (T) phases along with three different monoclinic phases MA, MB and MC. In the lower part is shown the phase diagram of PMN-PT with the cubic (C), tetragonal (T), rhombohedral (R) and monoclinic (M) phases shown; x axis is compositional fraction out of 1. See McLaughlin, Liu, and Lynch, Acta Materialia, Vol. 52(13), 2004, Pages 3849-3857, which is incorporated by reference.

601 Backing layer, e.g., Alumina loaded Epo-Tek 301
603 Piezoelectric substrate
605 First surface of the piezoelectric substrate
607 Second surface of the piezoelectric substrate
609 Second electrode(s), e.g., ground electrode
610 First electrodes, array of electrode elements
@ first region, first crystal structure, e.g., tetragonal
* second region, selected regions resulting in second crystal structure, e.g., rhombohedral or monoclinic
1201 Housing of ultrasound imaging probe
1203 Ultrasonic transducer
1205 Piezoelectric substrate
1207 Electrodes
1209 Electrical conductive channels
1301 Piezoelectric substrate in an interferometric optical device
1303 Surface of the substrate
1305 Electrode Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure. It should be understood that the order of the steps of the methods disclosed herein is immaterial so long as the methods remain operable. Moreover, two or more steps may be conducted simultaneously or in a different order than recited herein unless otherwise specified.

As used herein, the terms, "comprises" and "comprising" are to be construed as being inclusive and open ended, and not exclusive. Specifically, when used in the specification and claims, the terms, "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately", when used in conjunction with ranges of dimensions of particles, compositions of mixtures or other physical properties or characteristics, are meant to cover slight variations that may exist in the upper and lower limits of the ranges of dimensions so as to not exclude embodiments where on average most of the dimensions are satisfied but where statistically dimensions may exist outside this area. It is not the intention to exclude embodiments such as these from the present disclosure.

Unless defined otherwise, all technical and scientific terms used herein are intended to have the same meaning as commonly understood to one of ordinary skill in the art. Unless otherwise indicated, such as through context, as used herein, the following terms are intended to have the following meanings:

As used herein, the term "composite transducer" refers to a transducer based on a piezoelectric substrate that has mechanically mismatched elements within the substrate in order to decrease lateral clamping and increase sensitivity.

As used herein, the term "kerf" refers to a physical cut into a piezoelectric substrate separating piezoelectric elements within the substrate.

As used herein, the term "kerfless" refers to any pattern of piezoelectric elements that are defined within a substrate without physical separation and only by an electrode pattern.

As used herein, the terms "effective kerf" and "effectively kerfed" refer to any pattern of piezoelectric elements that are defined within a substrate, without physical separation and only by an electrode pattern, but which exhibit characteristics of mechanical and electrical separation.

Embodiments of the present disclosure are based, at least in part, on the discovery that a single piezoelectric material can be controllably divided into adjacent regions with single domain tetragonal and multidomain rhombohedral or monoclinic crystal structures by applying an electrode pattern to the substrate and performing quenching and poling (e.g., applying temporary applied DC electric field to a selected region of the substrate) steps. This technique can be used to create "effective kerfs" between the elements of a kerfless array or, by similar means, to produce a composite transducer whereby the composite pattern is effectively produced by inducing the two different crystal structure states in adjacent regions of the material, e.g., by using a quenching and selective poling technique as described below.

The "effective kerfs" represent regions of the quenched tetragonal crystal phase between the rhombohedral or monoclinic phase lying directly underneath the elements. The difference in stiffness between the two phases creates a mechanical impedance difference that tends to prevent the propagation of lateral vibrations, making each element's effective size smaller and thereby improving directivity similar to a kerfed array, or, in the case of a composite transducer, the rhombohedral or monoclinic state material under the electrode operates closer to the pillar mode of the material thereby improving electromechanical coupling ("pillar mode" refers to the response from the piezo material when formed in the shape of a pillar).

This is the first time, to our knowledge, that cooling rate has been shown to induce a room temperature stable phase transition in a relaxor-PT single crystal.

The piezoelectric coefficients of quenched tetragonal phase in piezoelectric materials according to embodiments of the present disclosure are lower than those of the rhombohedral or monoclinic phase, but are still much higher than those of other traditional single-crystal, single-domain ferroelectric crystals such as lithium niobate. As a result, piezoelectric materials according to embodiments of the present disclosure may have applications for optical, surface acoustic wave and bulk acoustic wave devices where scattering from grains or multi-domain structures limits the use of ceramics and multi-domain single crystal ferroelectrics. This technique may be useful in removing the manufacturing limitations associated with dicing and epoxy filling ultrasound arrays or composite transducers, such as thermal damage, contamination, and yield deficiencies.

In some embodiments, an "effectively kerfed" array has improved directivity over a conventional kerfless array. In some embodiments, directivity results for an "effectively kerfed" array are similar to a conventional kerfed array. The mechanical mismatch of the two crystal phases may allow one to produce much smaller arrays as construction and array geometry are no longer limited by dicing saw blade thickness or laser spot size but instead on photolithographic electrode patterning, which can be accomplished on a single crystal face if desired.

In some embodiments, piezoelectric arrays can be formed according to methods described herein. Traditionally, piezoelectric arrays used for beam focusing and beam steering are fabricated by mechanically kerfing and hence physically separating the piezoelectric substrate into elements using a saw or laser cutter. The smallest cutting tools and laser spot size limits the smallest size of piezoelectric elements and also the smallest separation distance of elements. By effectively kerfing the array the size and separation of the piezoelectric elements is limited only by the definition of surface electrodes using a lithographic process.

In some embodiments, dual frequency transducers can be formed according to methods described herein. The optimal operating frequency of a piezoelectric transducer is determined by the thickness of the piezoelectric substrate as a result of the thickness mode resonance. In traditional dual frequency transducers, substrates of different thicknesses are required to generate multiple operating frequencies. Since the mechanical properties in different crystal phases are significantly different, the resonance frequency for the same thickness of substrate is different for the different crystal phases and therefore two different resonant frequencies can be created in any pattern across a piezoelectric substrate with uniform thickness. In some embodiments, multiple frequency transducers can be formed according to methods described herein, by producing substrates with dual frequency as above and stacking such substrates with layers of different thicknesses. In some embodiments, a plurality of piezoelectric substrates are treated separately to produce substrates with dual frequency and are then combined to produce multiple frequency transducers. In some embodiments, a plurality of piezoelectric substrates are treated concurrently, by producing photoresists of multiple thicknesses and a plurality of electrodes specific to the selected regions of each layer using the methods described herein.

In some embodiments, composite transducers can be formed according to methods described herein. Composite transducers are often desired because the electromechanical coupling can be increased if a piezoelectric plate substrate is divided into many small piezoelectric elements due to the decreased lateral clamping. The smallest cutting tools and laser spot size limits the smallest size of piezoelectric elements that can be fabricated and also the smallest separation distance of elements. By effectively kerfing the composite, the size and separation of the piezoelectric elements are limited only by the definition of surface electrodes using a lithographic process.

In some embodiments, the ability to photolithographically define regions of a substrate with different mechanical properties has application to acoustic waveguiding and to surface and bulk acoustic wave devices. In order to create an acoustic waveguide, at least two mechanically different materials are required in order to reflect and or refract a travelling acoustic wave such that it remains within a predetermined path. Traditionally an acoustic waveguide is fabricated by bonding mechanically different materials together to create an acoustic mismatch. Using methods described herein, mechanically different neighboring substrates can be created within a single solid piezoelectric crystal by applying an electrode pattern and inducing different crystal phases.

In some embodiments, the fact that the phase transition is associated with changes in birefringence and/or index of refraction opens up the possibility that this technique could also be used in optical devices in, for example, optical waveguide or wavelength conversion devices. Conventionally these optical devices would require optical layers of different refractive index from either physically different materials or with a single material which has been doped to create regions with differing optical properties. With the technique described in this disclosure, we can create regions which are optically differentiated by depositing an electrode pattern and applying the temporary bias field. If the electrode pattern is interfering with the optical path then the electrodes can simply be removed after creating the regions of different crystal phase.

According to an embodiment of the disclosure, we describe a method of treatment that allows for manipulation of the crystal structure of portions of a piezoelectric material part that will persist at room temperature. In this method, heat is applied to the entire part to produce an initial phase transition throughout the part. The part is then subjected to rapid cooling and subsequently, or concurrently, a temporary bias electric field over specified portions of the part. This process results in material property differences in adjacent portions of the part that persist at room temperature and can be exploited to provide better or different overall operating responses of any devices incorporating the part.

The exact levels of heating, cooling rate and/or applied electric field will vary depending on material used and crystal structure desired. In some embodiments, the relaxor-based piezoelectric is heated to greater than or equal to the rhombohedral to tetragonal transition temperature but below the Curie temperature prior to quenching. In some embodiments, the piezoelectric material is heated to greater than or equal to the Curie temperature. In some embodiments, rapid cooling is achieved by using liquid nitrogen. In some embodiments, rapid cooling is achieved by using a water bath. In some embodiments, rapid cooling is achieved by using a cooling oil. In some embodiments, rapid cooling is achieved by using Helium. In some embodiments, the applied bias or electric field is less than 1 V/μm. In some embodiments, the applied bias or electric field is greater than 1 V/μm but less than approximately 1.5 V/μm. In some embodiments, the applied bias or electric field is greater than 1.5 V/μm but less than 5 V/μm. In some embodiments, the applied bias or electric field is greater than 5 V/μm but less than the dielectric breakdown field. In some embodiments the temporary field is applied for less than 5 minutes. In some embodiments the temporary field is applied for less than 1 hour but greater than 5 minutes. In some embodiments the temporary field is applied for less than 24 hours but greater than 1 hour. In some embodiments the temporary field is applied for less than 72 hours but greater than 24 hours. In some embodiments, the piezoelectric material is a rhombohedral single crystal PMN-PT, and rapid quenching from temperatures above $T_{RT}$ cause the single-domain tetragonal state to persist down to room temperature. This quenched state is robust against the application of pulsed voltages used for ultrasound, but when a temporary DC field greater than 1.5 V/μm is applied along the [001] axis for extended periods (e.g., 8 hours or more), the state undergoes a phase change back to the multi-domain rhombohedral state.

In some embodiments, the piezoelectric material is a monoclinic single crystal PMN-PT. and rapid quenching from temperatures above $T_{RT}$ cause the single-domain tetragonal state to persist down to room temperature. This quenched state is robust against the application of pulsed voltages used for ultrasound, but when a temporary DC field greater than 1.5 V/μm is applied along the [001] axis for extended period (e.g., for 8 hours or more), the state undergoes a phase change back to the multi-domain monoclinic state.

Figure 6:
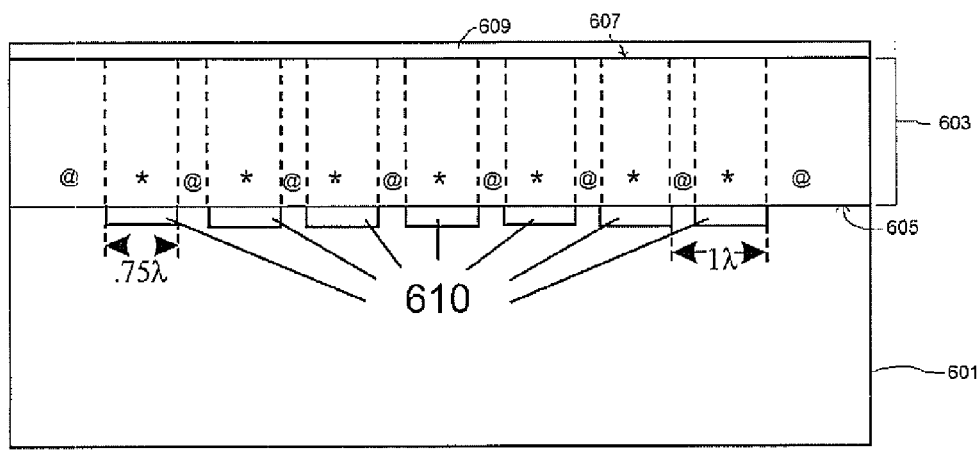
FIG. 6 shows an effectively kerfed array design.

In some embodiments, application of the electric field is effected by selective installation of electrodes; see FIG. 6 and the Examples below. A piezoelectric substrate 603 has regions denoted @ that underwent a first phase transition upon heating and quenching as above. The substrate also has selected regions denoted * that are intended to undergo a second phase transition upon application of the electric field at those regions. One or a plurality of electrodes 610 is installed on or adjacent to a surface 605 of the substrate 603, corresponding to the selected regions *. In some embodiments, electrodes 610 are sputtered as a layer and selectively removed as described herein, for example, by lithography. One or more reference or ground electrodes 609 (depicted in FIG. 6 as a single electrode spanning the substrate 603 laterally) is/are installed upon or adjacent to another surface 607 of the substrate 603, and an electric field producing a voltage difference is then applied between the electrode elements 610 and the electrode 609 at field strengths and times as described above, but in general at sufficient strengths and times as to produce a second phase transition in the selected regions *. In some embodiments, the plurality of electrodes 610 is an array of electrode elements. In some embodiments, the piezoelectric substrate 603 has dimensions suitable for producing an ultrasound acoustic resonance. In some embodiments, the electrode elements 610 have a pitch suitable for ultrasound beam steering. In some embodiments, one or matching layers is attached under the ground electrode layer.

In some embodiments, application of the electric field is effected by selective removal of a photoresist; see the Examples below. A photoresist layer is deposited on a surface of a piezoelectric substrate. A photolithographic pattern is applied to the photoresist layer, then the layer is developed such the photoresist is selectively removed, leaving regions of exposed piezoelectric surface upon which electrodes can be selectively applied as above.

In some embodiments, heating of the piezoelectric substrate is monitored by means of electrical impedance monitoring. The first phase transition (i.e., that transition which occurs during this heating) may be detected in a change in electrical impedance. By altering the desired temperature that is above the transition temperature as well as the time spent above that temperature, the temperature gradient, etc., optimal conditions for a particular piezoelectric material may be developed with reference to the speed at which an electrical impedance change occurs signalling a first phase transition.

In some embodiments, selectively applying the electric field to regions of the piezoelectric substrate is monitored by means of electrical impedance monitoring. The second phase transition (i.e., that transition that occurs during this electric field application) may be detected in a change in electrical impedance. By altering the field strength, the time spent at that strength, and the variation in strength (e.g., pulsing), etc., optimal conditions for a particular piezoelectric material may be developed with reference to the speed at which an electrical impedance change occurs signaling a second phase transition.

Applications of piezoelectric materials according to embodiments of the present disclosure and fabrication methods thereof include kerfless ultrasound arrays. As a kerfless array does not require dicing or epoxy filling of the gaps between elements, it is not as expensive to manufacture. However, there are inherent limitations associated with directivity with conventional kerfless array designs as compared to a kerfed array or a composite array. Among other things, kerfless arrays with markedly improved directivity can be produced using the embodiments of the present disclosure, traversing those limitations. In some embodiments, kerfless ultrasound arrays can be used in a Doppler ultrasound probe. In some embodiments, arrays can be used in an imaging probe, such as a high frequency array probe. In some embodiments, arrays can be used in a high frequency phased array probe.

To illustrate the performance that can be achieved according to various embodiments of the present disclosure, examples are presented. These examples show that heating, rapid cooling and application of an electric field to a selected portion of a piezoelectric substrate (either during or subsequent to cooling) can produce, among other things, single substrate transducers having piezoelectric arrays with adjacent sections manifesting different mechanical and electrical properties, transducer arrays with improved directivity, and transducers whose operating frequency can be changed back and forth. Methods according to various embodiments of the disclosure or equivalents thereof can also be exploited for other devices, such as sensors, transducers or waveguides, where it is desirable to exploit mechanical mismatch between neighboring regions of the substrate. Although only PMN-PT was used in the examples presented, similar piezoelectric materials that are susceptible to similar crystal structure phase manipulation using the techniques described are expected to exhibit similar material property changes as those described.

In some embodiments, the piezoelectric substrate has a relaxor piezoelectric composition. In some embodiments, the piezoelectric substrate is a relaxor-PT (relaxor-lead titanate) single crystal. In some embodiments, the piezoelectric substrate is formed from PMN. In some embodiments, the piezoelectric substrate is formed from PZT.

Figure 12:
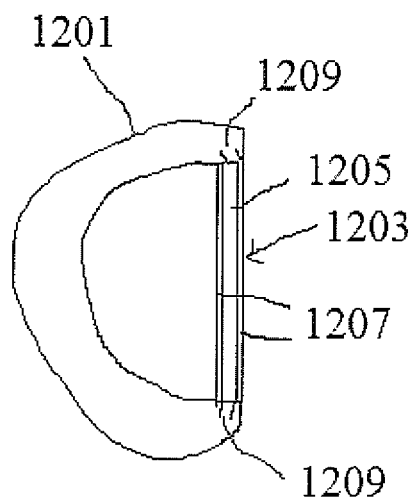
FIG. 12 shows an ultrasound imaging probe.

In some embodiments, an ultrasound imaging probe has a housing 1201 and an ultrasonic transducer 1203 inside the housing, the transducer having a piezoelectric substrate 1205 such that ultrasonic transducer is adapted to emit and/or receive ultrasound waves; and electrical conductance channels 1209 within the housing 1201 to electrically addressing each of the elements of the electrodes 1207. See FIG. 12.

Figure 13:
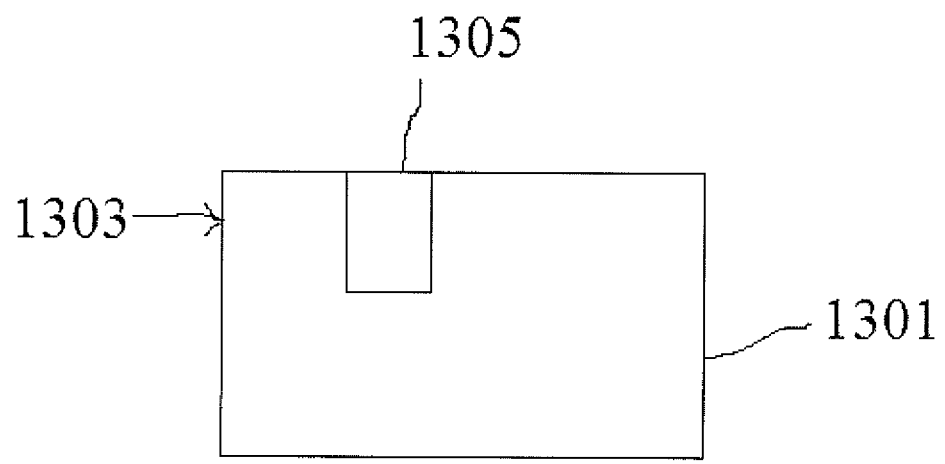
FIG. 13 shows an interferometric optical device.

In some embodiments, a piezoelectric substrate in an interferometric optical device 1301 has an electrode 1305 defined on a surface 1303 of the substrate 1301 such that the electrode is configured for inducing an electro-optical effect within said piezoelectric substrate. See FIG. 13.

The following examples are presented to enable those skilled in the art to understand and to practice embodiments of the present disclosure. They should not be considered as a limitation on the scope of the present embodiments, but merely as being illustrative and representative thereof.

EXAMPLES

Example 1

Dual-frequency Ultrasound Probe

Figure 2:
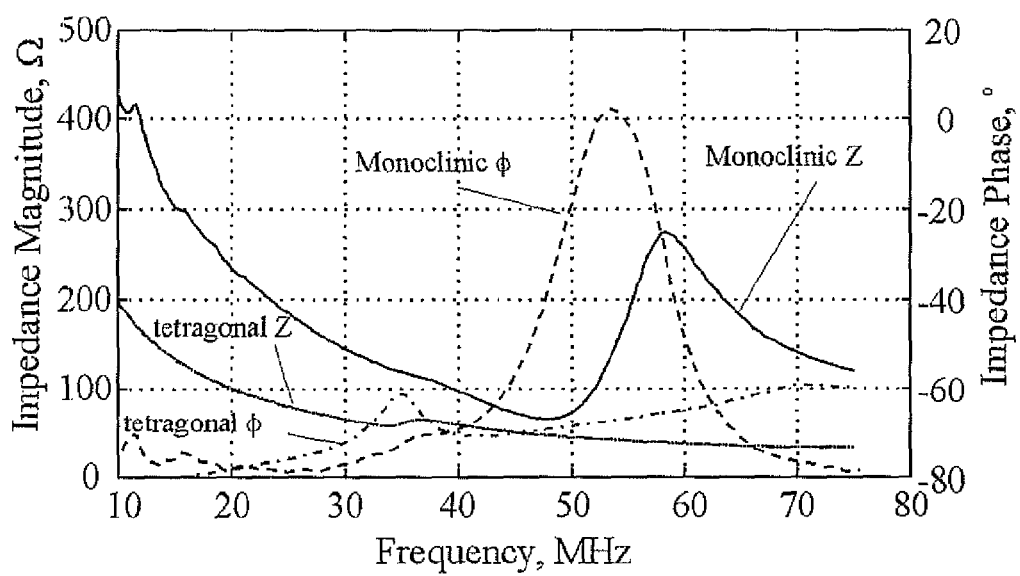
FIG. 2 shows impedance magnitude and phase for different crystal structures of a dual frequency ultrasound probe.
Figure 3:
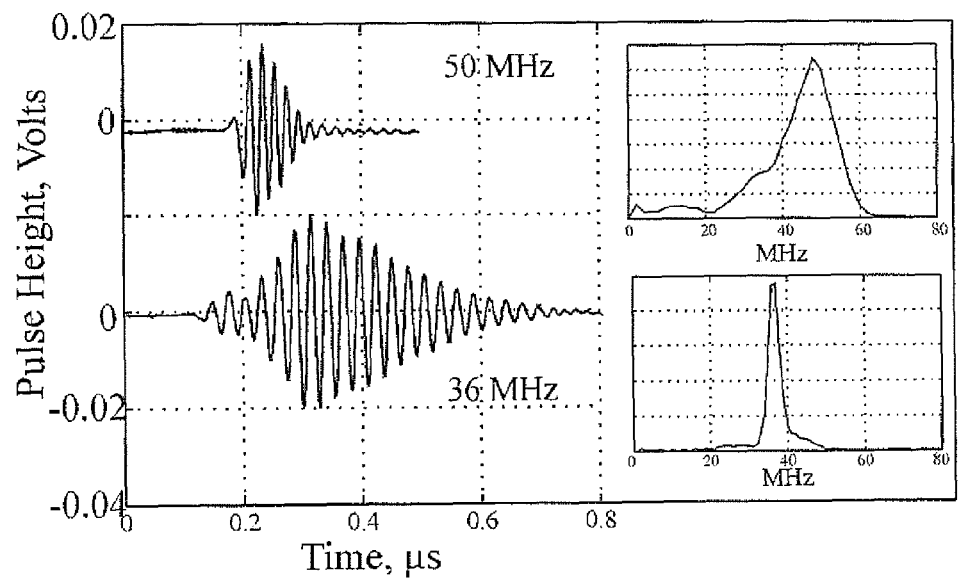
FIG. 3 shows pulse-echo waveform measurement results for different crystal structures of a dual frequency ultrasound probe.

For this Example, a single element ultrasound probe was constructed using a 500 µm diameter, 44 µm thick PMN-PT disk. The disk was connected to appropriate electrical cables and mounted on a small rod. The probe was then heated and rapidly cooled using liquid nitrogen with no applied electric field. The impedance magnitude and phase of the probe under this treatment are denoted tetragonal Z and tetragonal ϕ, respectively in FIG. 2. As can be seen, the impedance resonance of the probe occurred at approximately 36 MHz. Pulse-echo measurements were then performed on the probe to collect pressure waveform shown in FIG. 3 (denoted 36 MHz). The inset FFT of this waveform confirmed that the probe is operating at 36 MHz.

The procedure was then repeated on the probe prior to a temporary poling field of 1.5 V/µm being applied to the probe. The impedance magnitude and phase of the probe under this treatment are denoted monoclinic Z and monoclinic ϕ, respectively, in FIG. 2 and show that the impedance resonance now occurred at approximately 50 MHz. Pulse-echo measurements were performed on the probe in this state and the resulting pressure waveform is denoted 50 MHz in FIG. 3. Once again, the inset FFT graph of this waveform confirmed that the operating frequency of the probe has been changed to approximately 50 MHz.

These results indicate that, using this technique, the resonance frequency of the compressional mode of the probe has been markedly changed. Assuming no change in density, these modes have a 28% difference in speed of sound. This change is due to the crystal structure change that the technique has produced in the probe. Although not shown here, when the probe was treated such that both resonances were seen in the impedance graph, the pulse-echo waveforms contained components of both resonances.

Example 2

Kerfless PMN-PT Array

Figure 4:
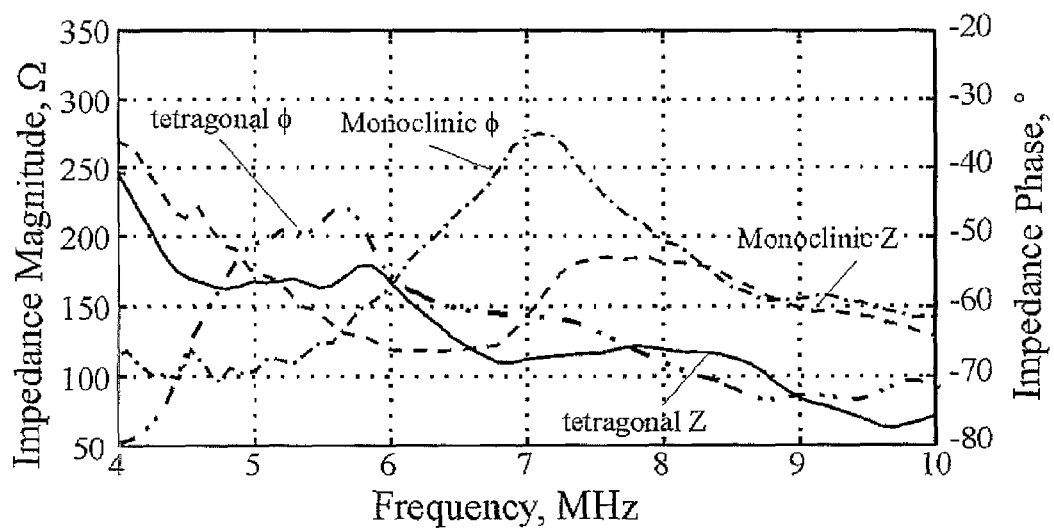
FIG. 4 shows impedance magnitude and phase for different crystal structures of a kerfless PMN-PT ultrasound array.

The ultrasound array, useful for kerfless ultrasonic transducers, considered in this example was constructed from PMN-PT piezoelectric substrate and has a 1λ pitch with 0.75λ, element width. 7 linear elements were produced by removing the electrodes at the specified intervals into the middle section of the substrate, which had overall substrate dimensions of 10×10 mm and resonant frequencies around 7 MHz. The backing layer of the arrays was built up from alumina loaded Epo-Tek 301 epoxy with 10% alumina by volume. No matching front layer was added to the arrays. FIG. 4 shows the impedance magnitude and phase profiles for the center element of the PMN-PT kerfless array. These graphs were obtained using an impedance analyzer (4294A, Agilent, Santa Clara, Calif.). Before the active electrode elements were produced into the array, the piezoelectric substrate was heated and cooled with an external electric field applied so that the rhombohedral or monoclinic crystal phase existed throughout the part. For this phase, the impedance magnitude and phase are denoted monoclinic Z and monoclinic ϕ, respectively, in FIG. 4. As can be seen, the array has a single resonant frequency at approximately 7 MHz, corresponding to the compression mode of the element.

Once array construction was complete, the arrays were mounted on a three-axis motorized stage system (Thorlabs, MTS50/M-Z8m, Newton, N.J.) and inserted into a distilled water test tank. A 40 µm needle hydrophone (Precision Acoustics Ltd., Dorset, UK) was placed in the tank and directly facing the array to track the pressure wave produced by the array. The output signal of the hydrophone was amplified using a Miteq (Hauppage, N.Y.) amplifier before being connected to an Agilent MSO-3502 oscilloscope (Santa Clara, Calif.) for data collection. The center element of the array was attached to the output of a pulser/receiver unit (FPGDragon, Daxsonics Inc, Halifax, NS) which provided the required 7 MHz transmit pulse. The synchronization channel was to trigger data collection. The remaining elements of the array were connected to a 50 ohm shunt to ground. A Matlab (Mathworks Inc) program was used to control the oscilloscope and motorized staging, and to retrieve and store the experimental data.

To begin the experiments, the orientation of the array was fine tuned to match that of the motorized staging, and the array center and the distance from the array to the hydrophone were determined. This data was entered into the Matlab program which would then move the array in an equidistant arc pattern about the hydrophone and collect the required pressure waveform from the hydrophone at 1° intervals. The collected pressure waveforms were post-processed in Matlab to determine the one way directivity pattern, defined as the ratio of the radial pressure difference to the maximum pressure difference seen on a single radial line. The directivity is considered good provided it remains above −6 dB.

Figure 5:
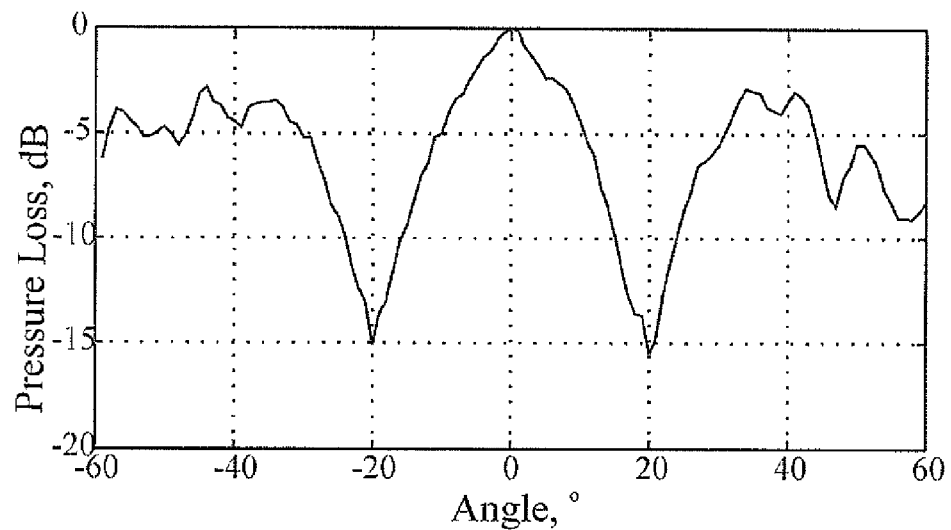
FIG. 5 shows a directivity pattern for a rhombohedral only PMN-PT kerfless array.

The experimentally obtained directivity plots for the rhombohedral or monoclinic PMN-PT array can be seen in FIG. 5. The results show characteristic center area of highest directivity with side areas of good directivity. For the experimental results, the center area is between ±12° and side areas are between ±29° and ±44°.

The array was then removed from the water tank and heated so that the tetragonal phase persisted throughout the array, as indicated by the impedance magnitude and phase denoted tetragonal Z and tetragonal φ, respectively in FIG. 4. As can be seen, the impedance resonance has been decreased by about 30% from that exhibited when the array was in the rhombohedral or monoclinic phase. The array was then rapidly cooled with liquid nitrogen so that the tetragonal phase persisted at room temperature. Next, an external electric field was applied to the array elements so that the rhombohedral or monoclinic crystal structure was restored to the material under the elements, as confirmed by impedance resonance shift, while the material in the gaps between the elements was assumed to remain in the tetragonal crystal structure.

Figure 7:
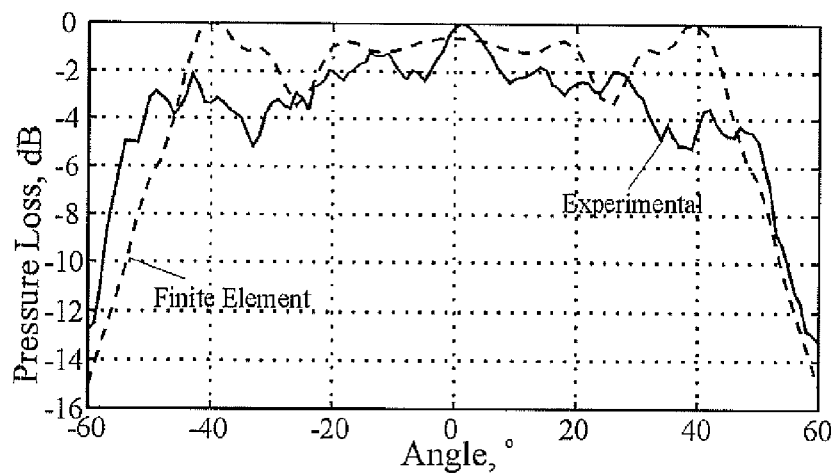
FIG. 7 shows a directivity pattern (solid line from experiment and dashed line as predicted by finite element calculations) for a PMN-PT kerfless array with rhombohedral crystal structure under the active elements and tetragonal crystal structure in gaps between active elements.

FIG. 7 shows the one-way directivity pattern that was then collected on the array in this crystal structure configuration in a manner similar to that previously described. As can be seen, the directivity of the array has improved markedly, with the −6 dB points located at about ±52°. In order to test the assumption that the improved directivity is due to the fact that the material under the unelectroded gaps between the elements has remained in the tetragonal crystal phase state, a finite element simulation was performed using PZFlex v2.4 (Weidlinger Associates Inc.) whereby the material under the active elements was assigned the properties of standard PMN-PT while the gap material properties were changed so that the stiffness constant in the compression mode corresponded to a 30% decrease in resonance frequency. These finite element results are included in FIG. 7, and show a striking similarity to the corresponding experimental results.

Example 3

Material Characterization of Different Room Temperature Phases

Piezoelectric substrates for this Example were <001> oriented PMN-32% PT samples (supplied by APC International Ltd, USA) and <001> oriented PMN-33 to 34% PT samples (supplied by TRS Technologies Inc.), USA. Quenched samples were prepared by heating to about 120 degrees C. (higher than $T_{RT}$ but lower than the Curie temperature) followed by rapid submersion in a liquid nitrogen bath. For the TRS samples, a very small bias field (<0.4 V/μm) applied in the opposite polarity to the original poling field was required during quenching in order to lock in the lower impedance resonance as indicated on an impedance analyzer. Multi-domain rhombohedral or monoclinic samples were prepared by applying a temporary bias electric field of 1.5 V/μm along the [001] axis at room temperature to the quenched samples after they had returned to room temperature.

The transition from rhombohedral or monoclinic to tetragonal crystal structure can be readily observed by examining the electrical impedance across the [001] axis of a sample. As the $T_{RT}$ temperature is crossed, the fundamental thickness-mode resonance frequency shifts downwards in quantized fashion (i.e., not a smooth drop in frequency) by approximately 25-30% in the samples we tested. This abrupt downward shift indicates a sudden decrease in the crystal stiffness and hence in the speed of sound in the [001] direction associated with a phase transition to the tetragonal phase. When a sample at a temperature above the $T_{RT}$ is rapidly quenched, this shifted resonance frequency persists when the sample is brought back up to room temperature indicating that the high-temperature phase remains. The resonance shift and hence the quenched phase has been observed to be stable over several weeks, even subjected to high-voltage pulsed RF electric fields.

Before conducting any heating, cooling or poling steps, we measured the electrical impedance of all samples in the poled state in which they arrived from the manufacturer. Most of the samples exhibited the two resonances that corresponded with the two fundamental thickness mode resonances inherent to the two crystal phases. This suggests that both crystal phases are existing simultaneously in these samples. In most of the samples however, the lower frequency resonance corresponding to the tetragonal phase had a very weak resonance as compared to the higher frequency rhombohedral or monoclinic resonance. In a few samples, only the higher monoclinic resonance was present in the crystals in their out-of-the-box state.

We measured the electrical impedance across each sample in the [001] direction using a precision Impedance Analyzer (Model 4294A, Agilent technologies, Santa Clara, Calif.) and confirmed that the resonance frequency could be switched back and forth between the two frequencies by crossing the $T_{RT}$ transition temperature and/or by heating/quenching/poling. To confirm that both resonance frequencies corresponded to thickness-mode responses, pulse-echo measurements were performed in a preliminary study using the same transducer in the tetragonal phase and poled rhombohedral or monoclinic phase. This work showed that when the transducer was in the two different states the centre frequencies of the pulses corresponded to the observed resonant frequencies in the impedance spectrum.

The clamped and unclamped dielectric permittivity of the samples was calculated from high frequency (>1.5 to 2.0× thickness mode resonance frequency) and low frequency (100-10⁵ HZ) impedance measurements. The APC PMN-32% PT samples had dimension of 1 cm×1 cm×150 μm and the TRS samples had dimensions of 1.7 cm×1.4 cm×375 μm. The capacitance, C, was determined from a best-fit to $$C = \frac{1}{2\pi f |Z|} \quad (1)$$

where f is the frequency and |Z| is the impedance magnitude.

Assuming that, well below or well above its resonance frequency, the substrate behaves as a parallel plate capacitor, the relative permittivity in the thickness direction is given by $$\varepsilon_{r,3} = \frac{Ct}{\varepsilon_o A} \quad (2)$$

where A is the top or bottom substrate surface area, t is the substrate thickness and $\epsilon_0 = 8.854 \times 10^{-12}$ F/m. The clamped (strain-free) relative dielectric, $\epsilon_{r,3}^S$, is found from the high frequency measurement; the unclamped (stress-free) relative dielectric, $\epsilon_{r,3}^T$, is found from the low frequency measurement.

Figure 8:
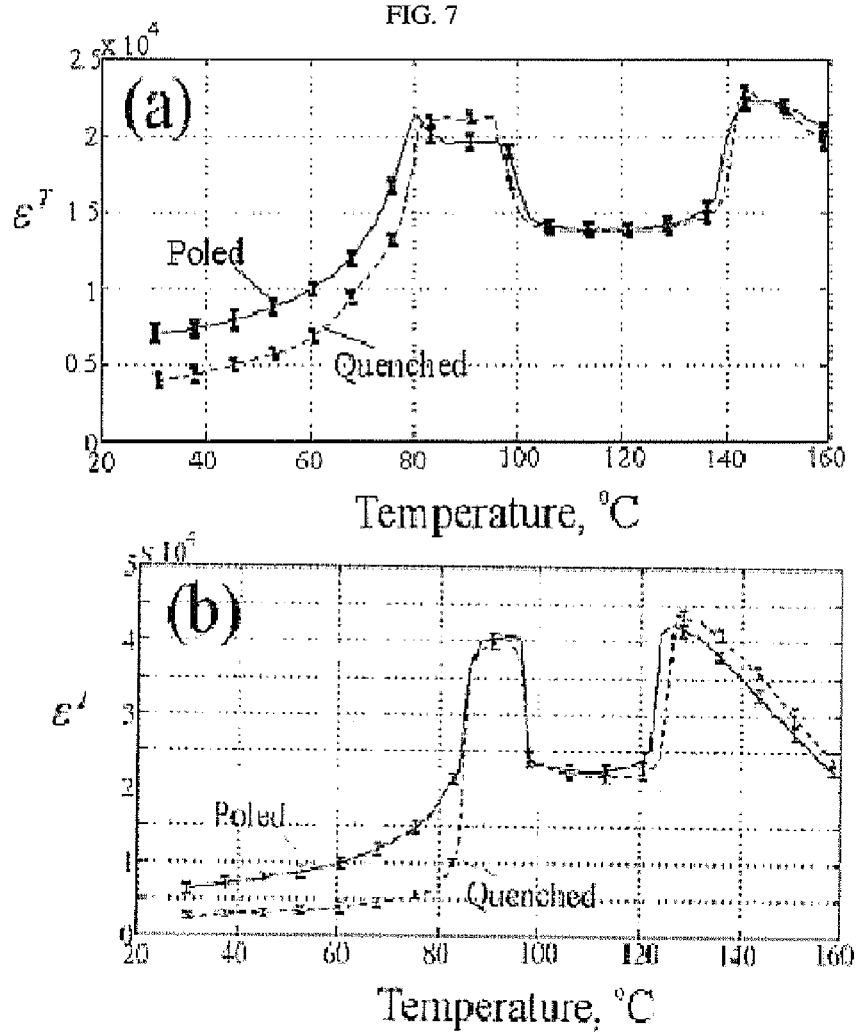
FIG. 8 shows the clamped relative dielectric vs. temperature curve for poled and quenched samples of (a) APC PMN-32% PT and (b) TRS PMN-33 to 34% PT.

FIG. 8(a) shows the mean poled and quenched clamped relative dielectric vs. temperature curve (collected during heating) for the 5 APC substrates used in this work; FIG. 7(b) shows the same for the 5 TRS samples. The error bars indicate the minimum and maximum values. As can be seen, the tetragonal crystal structure region occupies a clearly flat area of these curves between about 100° C. and 140° C. for the PMN-32% PT samples and 100° C. and 123° C. for the PMN-33 to 34% PT samples. Also, one can clearly see that the quenched samples of both sets of substrates show markedly lower clamped relative dielectric values at room temperature than when in a poled state at room temperature.

The electromechanical coupling of the substrate in pillar mode, $k_{33}$, and plate mode, $k_t$, was found from $$k_{33} = \sqrt{1 - \frac{\varepsilon_{r,3}^S}{\varepsilon_{r,3}^T}} \quad (3)$$

$$k_t = \sqrt{\frac{\pi}{2} \frac{f_r}{f_a} \tan\left(\frac{\pi}{2} \frac{f_a - f_r}{f_a}\right)}$$

where $f_a$ and $f_r$ are the anti-resonance and resonance frequencies, respectively. The open-circuit stiffness constant, $C_{33}^D$, the short-circuit stiffness constant, $C_{33}^E$, and the thickness mode piezoelectric stress coefficient, $e_{33}$, were obtained from $$C_{33}^D = (2t f_a)^2 \quad C_{33}^E = C_{33}^D(1-k_t^2) \quad e_{33} = k_t \sqrt{\varepsilon_{33}^S \varepsilon_0 C_{33}^D} \quad (4)$$

The values of these for poled and quenched samples are shown in the table below:

| | State | $\varepsilon_{33}^T$ | $\varepsilon_{33}^S$ | $k_t$ | $k_{33}$ | $C_{33}^D$ (GPA) | $C_{33}^E$ (GPa) | $e_{33}$ |
|---|---|---|---|---|---|---|---|---|
| APC PMN-32% PT | Poled | 7100 | 880 | 0.48 | 0.94 | 176 | 136 | 17.8 |
| | Quenched | 3400 | 515 | 0.43 | 0.92 | 75.6 | 61.3 | 8.1 |
| TRS PMN-33/34% PT | Poled | 6600 | 555 | 0.57 | 0.96 | 174 | 117 | 16.7 |
| | Quenched | 2420 | 500 | 0.40 | 0.89 | 77.4 | 65.1 | 7.7 |

In single crystal PMN-PT poled along the [001] axis of the cubic unit cell the tetragonal and monoclinic phases are easily distinguished using polarization microscopy because the tetragonal phase is uniaxial with its extraordinary axis pointing along the [001] axis. Consequently the crystal only has a single domain and will appear optically uniform. If the [001] axis is perfectly aligned with the optical axis of the microscope then rotation of the crystal about the [001] axis will not cause any modulation in the light transmitted through crossed polarizers. In contrast, the monoclinic $M_C$ phase has a polarization vector that lies at an angle to the [001] axis. Poling of the crystal in the [001] direction will orient the polarization vector of each unit cell towards any of the four <111> directions and the projection of this vector is equally likely towards any of these <111> directions. Consequently, domains form in the crystal plane with different orientations of the polarization vector and these domains are clearly visible in polarization microscopy due to their different birefringence. The resulting image is highly non-uniform and in color polarization microscopy results in random colors across the (001) plane in contrast to the uniformity of tetragonal crystals.

Polarized light microscopy was conducted with a Nikon Eclipse E600 microscope (Nikon Instruments, Melville, N.Y.) at 200× magnification. Photographs were taken with an attached Nikon E995 camera. The Cr/Au electrodes on both sides of the samples were first chemically etched off, and then the samples were polished using a Logitech PM5 precision lapping/polishing machine (Logitech, Glasgow, Scotland) with an OCON-399 polishing cloth and a 0.3 µm Aluminum oxide slurry. Photographs were taken of samples in each room temperature stable state as well as samples at an elevated temperature and a slowly cooled zero field state. These were obtained by heating the sample to about 120° C. using a hot plate and quickly taking pictures at a temperature above $T_{RT}$, during cooling, and after slow cooling to room temperature. Photographs of the quenched and TAF (temporarily applied field) samples were taken at room temperature several days after the sample preparation and polishing had been completed.

Two seven-element kerfless ultrasound arrays were fabricated from 10 mm by 10 mm wafers of the PMN-32% PT poled in the [001] direction with a thickness corresponding to a 7 MHz center frequency. The elements had a 1λ (215 µm) element-to-element pitch and 0.75λ (160 µm) element width. One of the arrays was fabricated as a conventional kerfless array by removing the Cr/Au electrodes at specified intervals on one surface of the PMN-PT substrate to define the array elements. A backing layer was made from alumina loaded Epo-Tek 301 epoxy with 10% alumina by volume. No matching layer was used on either array. The second array was produced in the same way, but after the electrodes were scratch-diced onto the array, the array was heated above $T_{RT}$ to about 120° C. and quenched in liquid nitrogen to put it in the quenched tetragonal state.

A 1.5 V/µm temporary DC field was applied to the element electrodes causing regions of the crystal lying under the electrodes to undergo a phase transition to the multidomain monoclinic state while leaving the regions in between the electrodes in the quenched tetragonal state to act as "effective kerfs". A diagram of an effectively kerfed array is shown in FIG. 6, the parts of which were described above.

Following array fabrication and creation of the effective kerfs, the arrays were mounted on a three-axis motorized stage system (Thorlabs, MTS50/M-Z8m, Newton, N.J.) and inserted into a distilled water test tank. A 40 µm needle hydrophone (Precision Acoustics Ltd., Dorset, UK) was placed in the tank directly facing the array to measure the pressure field produced by the array. The output signal of the hydrophone was amplified using a Miteq AU1466 (Hauppage, N.Y.) RF amplifier before being connected to an Agilent MSO-3502 oscilloscope for data collection. The center element of the array was attached to the output of a pulser/receiver unit (Daxsonics Inc, Halifax, NS) which provided the required 7 MHz transmit pulse. The synchronization channel was set to trigger data collection. The remaining elements of the array were connected to a 50Ω shunt to ground to match the impedance of the pulser-receiver circuit. A Matlab (Mathworks Inc) program was used to control the oscilloscope and motorized staging, and to retrieve and store the experimental data.

To begin measurements, the orientation of the array was fine-tuned to match that of the motorized staging, and the array center and the distance from the array to the hydrophone were determined. The Matlab program would then move the array in an equidistant arc pattern about the hydrophone and collect the required pressure waveform from the hydrophone at 1° intervals. The collected pressure waveforms were post-processed in Matlab to determine the one way directivity pattern.

Figure 9:
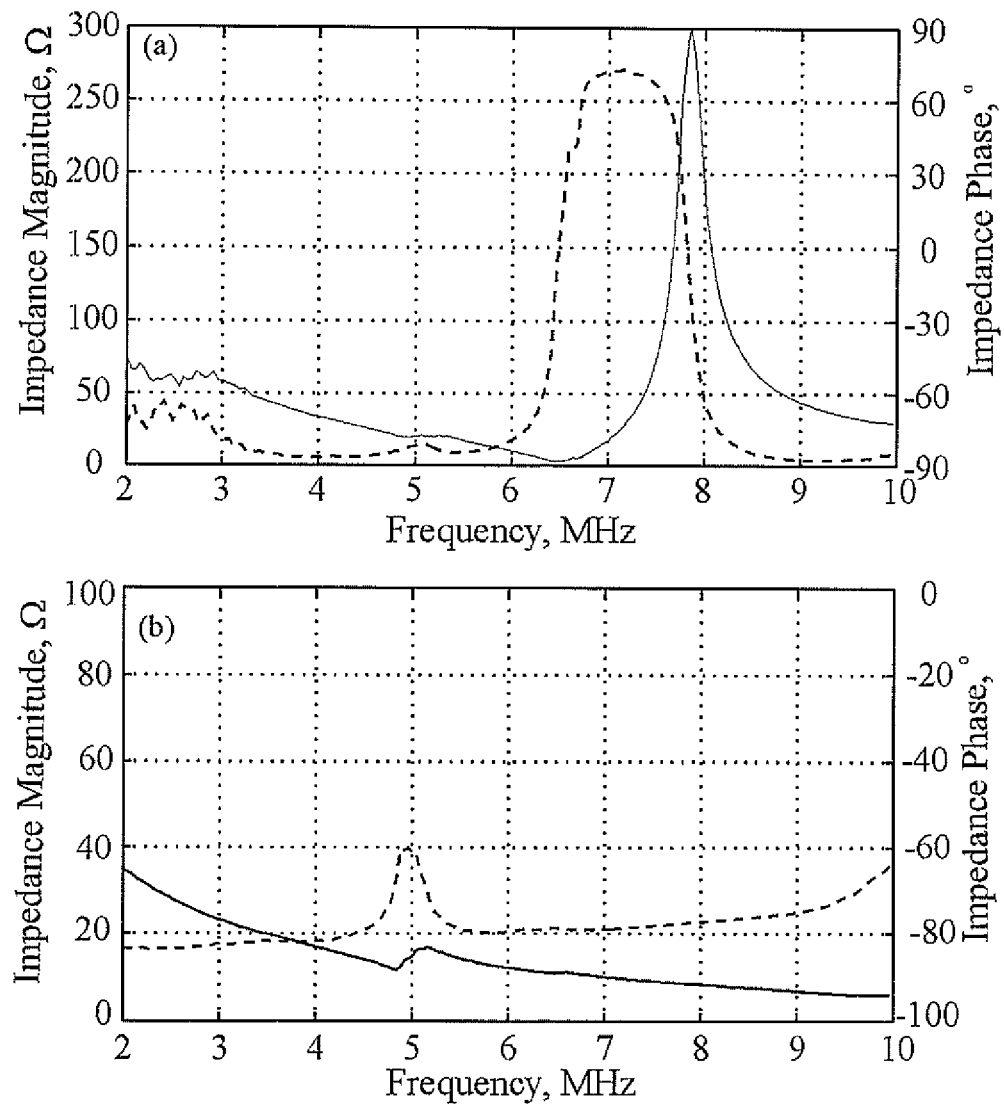
FIG. 9 shows impedance magnitude and phase for (a) a temporarily applied DC field sample and (b) a quenched sample as described in the Examples. Magnitude is indicated using solid lines and phase by dashed lines.

As can be seen in FIG. 9, the quenched sample exhibits a 30% lower resonance frequency than that of the poled TAF sample. The quenched sample also has a significantly lower peak impedance phase. (These samples had dimensions of 5×5×0.35 mm$^3$.) The quenched sample has a 12% lower stress-free relative dielectric constant, a 39% lower electromechanical coupling and a 27% lower short-circuit thickness mode mechanical stiffness, as seen in the following Table:

|  | $\epsilon_r^T$ | $k_t$ | $c_{33}^E$ (GPa) |
|---|---|---|---|
| TAF | 7400 | 0.57 | 112.5 |
| Quenched | 6740 | 0.35 | 82.6 |

Photographs taken (see U.S. Provisional Patent Ser. No. 61/612,421, incorporated by reference) show that the quenched sample has the same single-domain structure as the sample heated above $T_{RT}$. This is in contrast to the TAF and slowly cooled samples, which exhibit a multi-colored pattern caused by light experiencing a different degree of polarization rotation in each domain. This indicates that the crystal structure in these samples is multi-domain.

Figure 10:
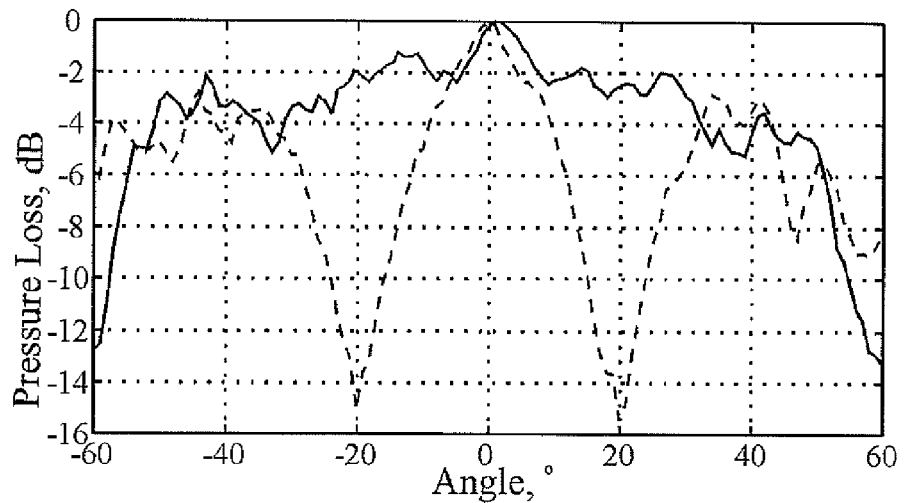
FIG. 10 shows one-way directivity results for effectively kerfed (solid line) and conventional kerfless (dashed line) arrays as described in the Examples.

FIG. 10 shows the one-way directivity patterns for two arrays. The solid line shows the result for the effectively kerfed substrate where the material of the gaps between the elements is in the quenched tetragonal phase and the material underneath the array elements is in the TAF monoclinic state. The dashed line shows the same result for the kerfless array when the entire substrate is in the poled monoclinic phase. It is clear from these two directivity patterns that the effectively kerfed array does not have the sharp dips occurring at approximately +/−20 degrees which is characteristic of a kerfless array. Using the −6 dB pressure drop criteria, the directivity for the multiphase array is ±52°, which is a marked improvement over the uniform array's directivity of ±12°.

The polarized light microscopy shows that PMN-PT subjected to rapid quenching in liquid nitrogen from temperatures well above $T_{RT}$ results in a material with the same birefringence as PMN-PT above $T_{RT}$. Impedance spectroscopy measurements show that the fundamental thickness mode resonance of rapidly quenched PMN-32% PT is also the same as in PMN-32% PT at temperatures above $T_{RT}$. Upon application of temporary DC electric field, clusters of domains with different birefringence become visible in the polarization microscopy and the fundamental thickness mode resonance moves abruptly to a higher frequency, making the crystal indistinguishable from the state achieved when the crystal is cooled from temperatures above the $T_{RT}$ (but below the Curie temperature) under zero-field conditions. It appears that the rapid quenching process quenches the high-temperature tetragonal state to a room temperature stable tetragonal state. The act of applying a temporary DC bias field causes the crystal to return to its equilibrium monoclinic state.

The existence of a thickness-mode resonance in the impedance plots excludes the possibility that the quenched samples have simply been depoled. The quenched samples still exhibit relatively strong piezoelectricity ($k_t \cong 0.40$) and the polarized light results exclude the possibility that this effect is due to the presence of material defects (i.e., trapped states). The impedance resonance shift and calculated material property results show that the crystal structure change is accompanied by significant mechanical and electrical property changes. After quenching, the sample is much softer and exhibits a lower electromechanical coupling. However, the electromechanical coupling value for the quenched samples is still on par with several other widely used piezoelectric materials. Therefore, the technique offers a novel way of creating dual operating frequency transducers.

While not wishing to be held to any particular theory, it could be that rapid removal of thermal energy prevents diffusion of the titanium atom so that it does not return to the monoclinic position it normally would under slower cooling rates. If this is the case, it may be possible to obtain similar results on a variety of PMN-PT substrates by quenching in a medium that has a faster cooling rate than liquid nitrogen. Using liquid nitrogen, it may be necessary to obtain substrates of slightly different PT percentages, such as PMN-33% PT or PMN-34% PT, in order to produce an effectively kerfed array from PMN-PT suppliers other than those discussed herein. Obtaining a persistent room temperature tetragonal crystal structure may be related to the crystal growth parameters, PT concentration, and cooling rate.

Example 4

Analysis and Preparation of a PMN-32% PT Effective Composite Transducer

The goal of this Example is to show the utility of a quenching/poling technique in producing a composite transducer without the need to cut and epoxy fill the piezoelectric substrate. In traditional composite transducers, the desired composite pattern, typically rectangular or square pillars, is first cut into a piezoelectric substrate with a micro-dicing or laser saw. Next, the gaps between the pillars are filled with epoxy. As the epoxy fill is much softer than the piezoelectric substrate, this technique removes the lateral clamping associated with the plate vibration mode of the substrate and forces the transducer to respond as a series of mechanically decoupled pillars. As the pillar mode of piezoelectric material is typically more efficient, the overall electromechanical efficiency of the substrate is greatly improved. The composite substrate is then cut to the desired shape for the device in which it is intended to be used, be it sensor, actuator or transducer.

In this Example, the composite pattern was developed by photolithography and the quenching/poling technique, as opposed to cutting and epoxy filling. The piezoelectric substrates for this Example were <001> oriented PMN-33-34% PT. Quenched samples were prepared by heating to about 120 degrees C. (e.g., to a temperature higher than $T_{RT}$ but lower than the Curie temperature) and applying a slightly (<0.4 V/μm) reversed bias field (in relation to the direction of original poling) followed by rapid submersion in a liquid nitrogen bath.

After the quenched state had been confirmed via impedance measurement, the electrodes were removed from both sides of the sample, and the sample was ground down to a thickness of approximately 180 μm from its original thickness of 375 μm in order to obtain the proper volume ratio for which the photomask was designed. The sample was then polished using 0.3 μm grit optical grade sandpaper. One side of the sample was then spun-coated with HMDS and photoresist liquid. The sample was then mounted beneath the photomask in a photolithography system and exposed to ultra-violet light for approximately 1.6 seconds. Next, the sample was placed in a bath of photoresist developer for approximately 9 minutes.

Next, aluminum electrodes were deposited over both sides of the piezoelectric substrate. The substrate was then subjected to a bias electric field of around 0.6 V/μm so that the portion of the substrate that did not have photoresist between the electrode and substrate surface was forced into the monoclinic poled state while the rest of substrate remained in the tetragonal quenched state owing to the large electrical impedance of the photoresist. In this way, the substrate has been transformed into an effective composite substrate.

Figure 11:
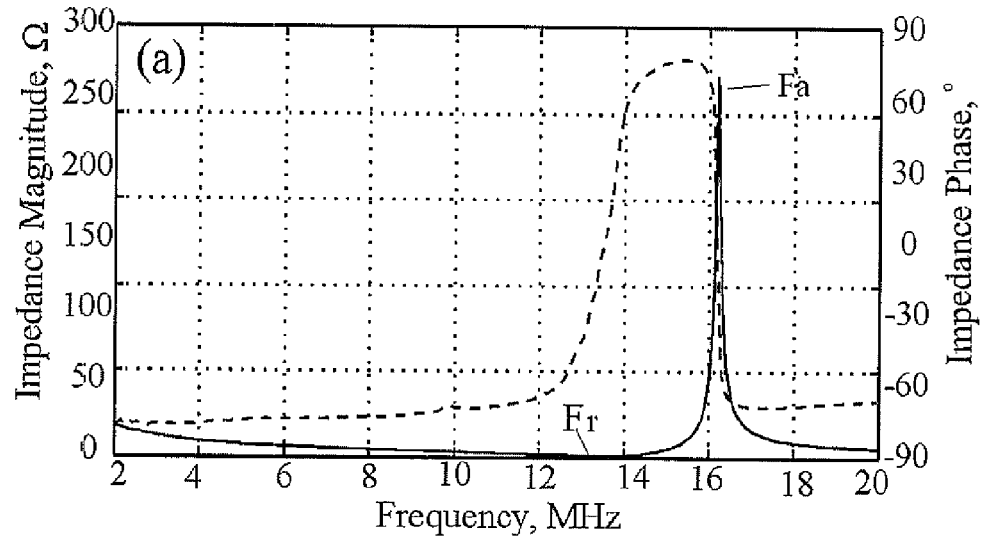
FIG. 11 shows impedance magnitude and phase curves of a piezoelectric substrate before and after application of a technique described in Example 4 to produce an effective composite pattern. Magnitude is indicated using solid lines and phase by dashed lines.
Figure 11:
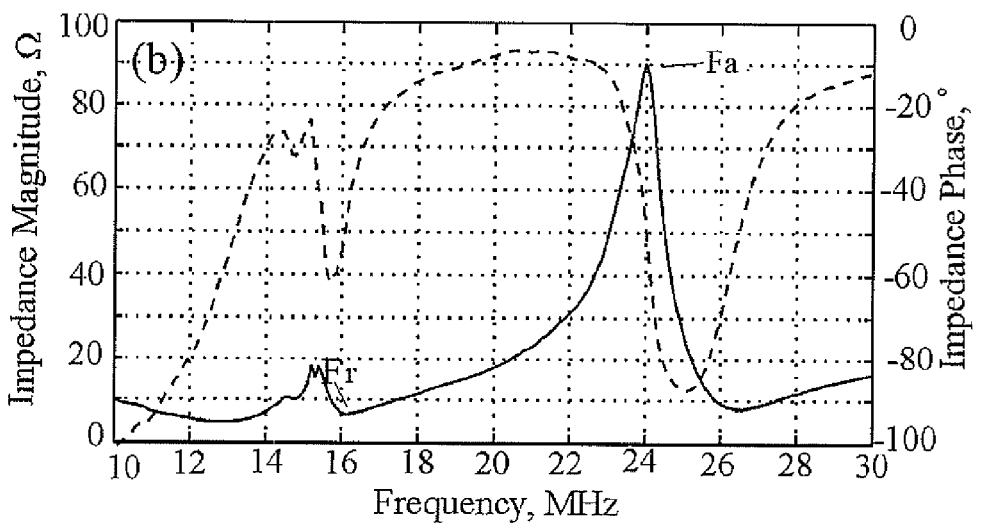

Impedance curves of this effective composite substrate were collected using an impedance analyzer. FIG. 11(a) shows the original impedance curve of the substrate prior to lapping and effective composite preparation and FIG. 11(b) shows the impedance curve of the same substrate with the effective composite pattern. As can be seen, the resonance frequency has increased due to the lapping procedure (i.e., the thickness of the effective composite substrate is less than the original substrate). One can also see that the resonance and anti-resonance frequencies are much further apart relative to one another. The effective electromechanical efficiency is given by $$k_t = \sqrt{\frac{\pi}{2}\frac{f_r}{f_a}\tan\left(\frac{\pi}{2}\frac{f_a - f_r}{f_a}\right)}$$

where $f_a$ is the anti-resonance frequency and $f_r$ is the resonance frequency.

Using the values for resonance and anti-resonance frequencies indicated in FIGS. 10(a) and (b) for the original and effective composite substrates, we find that the electromechanical efficiency, $k_t$, has increased from 0.53 to 0.74. From these calculations, we can see that the effective composite is more efficient than the original substrate. As such, this technique can be used to improve the efficiency for any transducer, actuator or sensor. Although shown for PMN-PT, it is expected that this technique will be valid for any relaxor-PT material that exhibits the resonance frequency change upon quenching.

Example 5

Acoustic Waveguides

An acoustic waveguide can be created from a channel of one material whose walls are made of a different material. If the speed of sound in the channel the region is slower than in the surrounding region, then there will exist a range of angles for which incident sound waves approaching the interface will experience total internal reflection, allowing a sound wave to propagate losslessly in the channel. Acoustic waveguides can be made by cutting or etching grooves into a substrate or by laminating different materials together to form interfaces. In some embodiments, an acoustic waveguide uses the control of crystalline phases in a piezoelectric substrate to create a channel in a single material.

In one embodiment that acts as an acoustic waveguide for Lamb waves, a PMN-PT substrate is lapped to a desired thickness, and electrodes are sputtered onto both sides of the substrate. A photoresist is then spin-coated onto either one or both sides of the sample. Using photolithography, the photoresist will be left unexposed in regions act as waveguide channels and will be exposed in those regions not meant to act as waveguide channels. The unexposed photoresist can then be removed using a solvent and a chemical etchant used to remove the electrodes in those regions meant to act as waveguide channels. The entire PMN-PT substrate is then heated above the transition temperature $T_{RT}$ but below the Curie temperature until the crystal undergoes a phase transition to the tetragonal phase. For PMN-PT 32% this will be a temperature of approximately 120 degrees C. The electrical impedance of the electrode regions may be monitored during heating to detect when the phase change takes place. A characteristic sudden drop in resonance frequency of 25-30% indicates the transition to the tetragonal state. Once the entire substrate is in the tetragonal state, it is quenched in a liquid nitrogen bath and slowly brought up to room temperature so that the tetragonal phase persists at room temperature. An electric field of between 1 V/um and 5 V/um is then applied across the electrode regions in on the two sides. Regions covered by electrode on both sides will undergo a phase transition to a rhombohedral or monoclinic phase (depending on the composition). The monoclinic and rhombohedral phases have greater speeds of sound owing to their higher stiffness, while the waveguide channel regions have the lower stiffness and lower speed of sound of the tetragonal phase. Thus a waveguide is formed in the unelectroded regions. Additionally, since the tetragonal phase is still piezoelectric, acoustic waves may be excited by adding electrodes covering the channel region that are electrically disconnected from the electrodes outside the channel region. After the quenching and repoling steps have been performed electrical connections may be made to the electrodes in the channel by wire bonding. These electrodes, when excited with a voltage, will create Lamb waves that will propagate along the waveguide. Generally the same steps may be used to form waveguides for surface acoustic waves in piezoelectric substrates, except that the channel electrodes should be designed to generate surface acoustic waves.

Example 6

Optical Waveguides

Cheng ("Dielectric and electrooptic properties of PMN-PT single crystals and thin films", PhD Dissertation, Hong Kong Polytechnic University; incorporated by reference) has demonstrated that optical waveguides can be made from PMN-PT both in bulk single crystals and as a thin film deposited on a MgO substrate. The waveguides can be made by photolithographic definition of waveguide channels through the removal of material outside of the waveguide. In single-crystal form, 68PMN-32PT was also shown to exhibit a large linear electro-optical coefficient reff=217 pm/V at 633 nm, 7 times higher than that for lithium niobate (reff=31 pm/V), making PMN-PT a suitable material for Pockels cells, electro-optical switches. Other studies have found that PMN-PT has a similarly large non-linear optical susceptibility making it suitable for, non-linear frequency conversion devices.

Numerous researchers use PMN-PT from the high PT content part of the phase diagram where the room-temperature phase is tetragonal and therefore a transparent single crystal. However, at these high-PT compositions, electro-optic and non-linear effects are weaker. For example, the linear electro-optical coefficient reff drops from 217 pm/V at 32% PT to 50 pm/V at 38% PT, so there is an advantage to working close to the morphotropic phase boundary. Typically for optics applications, the multi-domain monoclinic and rhombohedral phases are avoided due to optical scattering from the domains, and the single-domain tetragonal phase is preferred. The quenching technique allows for tetragonal-phase PMN-PT to be created at compositions near the MPB to take advantage of the higher electro-optical and non-linear optical coefficients.

In one embodiment, a periodically poled non-linear frequency conversion device may be created by photolithographically defining electrodes along the two surfaces of a PMN-PT substrate and applying electric poling fields of between 0.1 um/V and 5 um/V to adjacent electrodes in such a way that the field applied to adjacent electrodes is opposite in polarity. The spacing between the electrodes is chosen to satisfy quasi-phase-matching conditions in the material. The sample is then heated to above the transition temperature $T_{RT}$ so that the substrate is in the tetragonal phase, but with the PMN-PT under adjacent electrodes having opposite ferroelectric dipole direction due to the opposite electric field polarity. As a consequence, the second-order non-linear susceptibility is also reversed in the substrate under adjacent electrodes. The DC electric fields are then removed and the sample is quenched in liquid nitrogen, so that the crystal remains in the tetragonal phase, and the opposing directions of the ferroelectric dipole remain in place. When light propagates through the material along the direction orthogonal to the electrodes it will be up-converted to double frequency. Such structures can also be used to create sum and difference frequencies between two light beams of difference frequencies.

In another embodiment that acts as an electro-optical phase shifting device, a 100 nm thick, transparent layer of indium tin oxide (ITO) is sputtered onto a lapped and polished PMN-PT substrate. An electric field is applied to the electrodes to pole the PMN-PT and the substrate is heated to a temperature above the $T_{RT}$, but below the Curie temperature, for a time known to induce a complete phase change to the tetragonal state. The electric field is removed and the entire substrate is quenched in a liquid nitrogen bath. After quenching, the sample will remain in the tetragonal state and AC voltages applied to the ITO electrodes will induce changes in the total phase acquired by light in passing through the PMN-PT through the electro-optic effect. Such an electro-optic device may be made into an optical switch by incorporating it into a Mach-Zehnder interferometer or a polarization-mode interferometer or through other means known in the art.

All non-cubic phases of PMN-PT are birefringent, with the extraordinary axis lying in the direction of the spontaneous ferroelectric dipole. Consequently, monoclinic and rhombohedral phases exhibit a different direction for the extraordinary axis than the tetragonal phase. Light propagating in a PMN-PT crystal divided into monoclinic/rhombohedral and tetragonal regions would experience reflections at the boundaries between regions. A waveguide created by the technique described in Example 5 would also act as a waveguide for light. In tetragonal PMN-PT the extraordinary axis is faster than the extraordinary axis. The waveguide can lead to improved confinement of light, further improving the non-linear wavelength conversion efficiency achieved in a given distance.

The invention claimed is:

1. A piezoelectric device comprising:
   a piezoelectric substrate having a relaxor composition, said piezoelectric substrate comprising:
      an array of first piezoelectric regions; and
      an array of second piezoelectric regions, wherein each second region is laterally adjacent to at least one respective first piezoelectric region; and
   an array of electrodes formed adjacent to a first surface of said piezoelectric substrate, each electrode of said array of electrodes being located adjacent to a respective first piezoelectric region;
   one or more reference electrodes formed adjacent to a second surface of said piezoelectric substrate;
   wherein said first piezoelectric regions and said second piezoelectric regions exhibit a difference in stiffness, such that said array of first piezoelectric regions form an effectively kerfed piezoelectric array.

2. The piezoelectric device according to claim 1 wherein said first piezoelectric regions and said second piezoelectric regions further exhibit a difference in one or more electrical, electromechanical, pyroelectrical or optical properties.

3. The piezoelectric device according to claim 1 wherein said piezoelectric substrate is formed from a relaxor-PT material.

4. The piezoelectric device according to claim 3 wherein the relaxor-PT material is (1−x)[Pb(Mg1/3Nb2/3)O3]−x [PbTiO3] (PMN-PT).

5. The piezoelectric device according to claim 1 wherein said first piezoelectric regions are characterized by a multi-domain rhombohedral state.

6. The piezoelectric device according to claim 1 wherein said first piezoelectric regions and said second piezoelectric regions are stable at room temperature.

7. The piezoelectric device according to claim 1 wherein the difference in the stiffness among said first piezoelectric regions and said second piezoelectric regions is formed by applying a DC electric bias field to said one or more first piezoelectric regions after having quenched said piezoelectric substrate from a temperature above a phase transition temperature.

8. The piezoelectric device according to claim 7 wherein the DC electric bias field is at least 1 volt per micrometer.

9. The piezoelectric device according to claim 7 wherein said piezoelectric substrate was maintained in a tetragonal phase prior to quenching.

10. The piezoelectric device according to claim 1 wherein said first piezoelectric regions define at least one linear segment within a plane of said piezoelectric substrate, and wherein a difference in acoustic properties between the linear segment and neighbouring regions of the piezoelectric substrate are suitable for supporting guided acoustic waves within the linear segment.

11. The piezoelectric device according to claim 1 wherein said first piezoelectric regions define at least one linear segment within a plane of said piezoelectric substrate, and wherein a difference in the refractive index between the linear segment and neighbouring regions of the piezoelectric substrate are suitable for supporting guided optical waves within the linear segment.

12. The piezoelectric device according to claim 1 wherein the piezoelectric substrate exhibits two ultrasound resonant frequencies.

13. The piezoelectric device according to claim 1 wherein the array of ultrasound elements has a pitch suitable for ultrasonic beam steering.

14. An ultrasonic imaging probe comprising a piezoelectric device according to claim 1.

15. An ultrasonic transducer comprising:
a piezoelectric device according to claim 1;
wherein the difference between the stiffness of said one or more first piezoelectric regions and said second piezoelectric regions causes said ultrasonic transducer to oscillate in an ultrasonic pillar mode.

16. A method of forming regions of varying mechanical properties within a piezoelectric substrate, wherein the piezoelectric substrate has a relaxor piezoelectric composition such that a phase transition to a crystal structure occurs when the piezoelectric substrate is heated above a transition temperature, the method comprising:
forming an array of electrodes formed adjacent to a first surface of said piezoelectric substrate;
forming one or more reference electrodes formed adjacent to a second surface of said piezoelectric substrate;
heating the piezoelectric substrate above the transition temperature and below the Curie temperature;
quenching the piezoelectric substrate to a temperature below the transition temperature; and
applying an electric field between the array of electrodes and the one or more reference electrodes, wherein the electric field strength is sufficient to alter the mechanical properties of first piezoelectric regions adjacent to respective electrodes of said array of electrodes, said first piezoelectric regions thereby forming an effectively kerfed piezoelectric array, such that a difference in stiffness is formed between said first piezoelectric regions and second piezoelectric regions residing adjacent to said first piezoelectric regions.

17. The method according to claim 16 wherein the adjacent regions exhibit a reduced stiffness relative to the selected regions.

18. The method according to claim 16 further comprising applying a bias field during quenching, wherein the polarity of the bias field is opposite to that of a previously applied poling field.

19. The method according to claim 16 wherein the electric field is greater than approximately 1 Volt per micrometer.

20. The method according to claim 16 further comprising measuring the electrical impedance of the piezoelectric substrate while heating the piezoelectric substrate above the transition temperature, and determining when the first phase transition has occurred based on the electrical impedance.

21. The method according to claim 16 further comprising measuring the electrical impedance of the piezoelectric substrate while applying the electric field to the selected regions, and determining when the mechanical properties have been altered based on the electrical impedance.

22. The method according to claim 16 further comprising varying the strength of the electric field during its application, and tracking the change in electrical impedance of the piezoelectric substrate while varying the strength of the electric field so as to determine the electric field strength required to alter the mechanical properties.

23. The method according to claim 16 wherein the crystal structure is tetragonal.

24. The method according to claim 16 wherein the piezoelectric substrate has a rhombohedral crystal structure prior to the first phase transition.

25. The method according to claim 16 wherein said selected regions define at least one linear segment therebetween within a plane of said piezoelectric substrate, and wherein a difference in acoustic properties between the linear segment and neighbouring regions of the piezoelectric substrate are suitable for supporting guided acoustic waves within the linear segment.

26. The method according to claim 16 wherein said selected regions define at least one linear segment within a plane of said piezoelectric substrate, and wherein a difference in the refractive index between the linear segment and neighbouring regions of the piezoelectric substrate are suitable for supporting guided optical waves within the linear segment.

* * * * *

UNITED STATES PATENT AND TRADEMARK OFFICE
CERTIFICATE OF CORRECTION

PATENT NO. : 9,728,708 B2
APPLICATION NO. : 14/352938
DATED : August 8, 2017
INVENTOR(S) : Philip P. Garland et al.

It is certified that error appears in the above-identified patent and that said Letters Patent is hereby corrected as shown below:

In the Specification

Column 1, Line 12, "611612,421" should be --61/612,421--.

Column 13, Line 2, "∈" should be --ε--.

Column 13, Line 3, "∈" should be --ε--.

Column 13, Line 5, "∈" should be --ε--.

Column 15, Line 26, "∈" should be --ε--.

Signed and Sealed this
Twenty-eighth Day of November, 2017

Joseph Matal
*Performing the Functions and Duties of the
Under Secretary of Commerce for Intellectual Property and
Director of the United States Patent and Trademark Office*